United States Patent [19]

Tomita

[11] Patent Number: 5,642,372
[45] Date of Patent: Jun. 24, 1997

[54] QUANTUM-WELL TYPE SEMICONDUCTOR LASER DEVICE HAVING MULTI-LAYERED QUANTUM-WELL LAYER

[75] Inventor: Akihisa Tomita, Tokyo, Japan

[73] Assignee: NEC Corporation, Tokyo, Japan

[21] Appl. No.: 364,269

[22] Filed: Dec. 27, 1994

[30] Foreign Application Priority Data

Dec. 27, 1993 [JP] Japan .................. 5-330429

[51] Int. Cl.⁶ .................................................. H01S 3/19
[52] U.S. Cl. .................................................. 372/45
[58] Field of Search .................................. 372/45, 46, 44

[56] References Cited

U.S. PATENT DOCUMENTS

| 5,351,254 | 9/1994 | Tomita ............... | 372/45 |
| 5,425,041 | 6/1995 | Seko et al. .......... | 372/45 |
| 5,425,042 | 6/1995 | Nida et al. .......... | 372/45 |

FOREIGN PATENT DOCUMENTS

| 62-035591 | 2/1987 | Japan . |
| 4350988 | 12/1992 | Japan . |

OTHER PUBLICATIONS

Patent Abstracts of Japan, vol. 17, No. 213 (E–1356), 26 Apr. 1993.
Patent Abstracts of Japan, vol. 11, No. 212 (E–522), 9 Jul. 1987.

Yuh, Perng–Fei, et al., "Novel Infrared Band–Aligned Superlattice Laser", Applied Physics Letters, vol. 51, No. 18, Nov. 2, 1987, New York, pp. 1404–1406.

Hirayama, H., et al., "Estimation of Carrier Capture Time of Quantum–Well Lasers by Spontaneous Emission Spectra", Applied Physics Letters, vol. 61, No. 20, Nov. 16, 1992, New York, pp. 2398–2400.

*Primary Examiner*—James W. Davie
*Attorney, Agent, or Firm*—Sughrue, Mion, Zinn, Macpeak & Seas

[57] ABSTRACT

The present invention provides a quantum-well semiconductor laser device having a substrate, a clad layer on the substrate, an optical confinement layer on the clad layer, an active layer on the optical confinement layer, an optical confinement layer on the active layer and a clad layer on the optical confinement layer each of which formed of a semiconductor wherein the active layer formed of a multi-layer quantum-well structure of which each layer comprising a quantum-well layer, a first barrier layer adjacent the quantum-well layer and a second barrier layer adjacent the first barrier layer wherein the semiconductor of the first barrier has a higher energy level at a $\Gamma$ point of a valence band than that of the second barrier layer.

17 Claims, 4 Drawing Sheets

QUANTUM-WELL TYPE SEMICONDUCTOR LASER DEVICE HAVING MULTI-LAYERED QUANTUM-WELL LAYER

BACKGROUND OF THE INVENTION

1. Field of the Invention

The present invention relates to a quantum-well type semiconductor laser device, and more specifically to a quantum-well type semiconductor laser device having a multi-layered quantum-well layer.

2. Description of Related Art

A multi-layered quantum-well structure is introduced to a semiconductor laser device in order to reduce threshold current, to increase quantum efficiency, to enable functions at high temperatures and high speed modulations. In this connection, if discontinuity between conduction bands of the quantum-well layer and of a barrier layer is small, electrons thermally distributes not only in the quantum-well layer but also in the barrier layer, so that characteristics of the semiconductor laser device is not improved, despite of the multi-layered quantum-well structure. Therefore, in a prior art, it is preferable that there is a large energy level difference between forbidden bands of the quantum-well layer and of the barrier layer.

On the other hand, it has been studied applying a distortion quantum-well structure to the semiconductor laser device in which the quantum-well is constituted by a semiconductor having larger lattice parameters than a substrate. The distortion quantum-well structure contributes change of structure of a valence band so as to reduce an effective mass of the lowest energy level hole. In order to obtain this effect of the distortion quantum-well structure, discontinuity between the valence bands should become large so as to increase difference between energy levels of the lowest level positive hole and an excitation level positive hole.

However, if there is a large energy level difference between forbidden bands of the quantum-well layer and of the barrier layer so as to have a large discontinuity of the valence bands, positive holes are strongly trapped in the quantum-well. In case of the multi-layered quantum-well structure, this causes localization of positive holes in which positive holes are concentrated at a quantum-well near a p-clad layer so that a little positive holes are implanted in quantum-wells far from the p-clad layer. The quantum-wells in which a little positive holes are implanted do not contribute gain so that the characteristics of the laser are not improved. Namely, the effect of the quantum-well and the localization of the positive holes are trade-off.

In prior arts, it has been tried to reoptimize the energy level difference between the forbidden bands of the quantum-well layer and of the barrier layer. For example, Takaoka and Kushibe reported that a characteristic temperature of quantum efficiency of a 1.3 μm band InGaAsP quantum-well laser was optimized when its InGaAsP barrier layer composition had a forbidden band wave length of 1.13 μm (Proc. 54th Conf. J. Appl. Phys. Lecture No. 28p-H-3, pp. 1024). Ogita et al. reported that a characteristic temperature of a 1.3 μm band InGaAsP distortion quantum-well laser became maximum when its InGaAsP barrier layer composition had a forbidden band wave length of 1.1 μm (Proc. 54th Conf. J. Appl. Phys. Lecture No. 28p-H-5, pp. 1025). Kito et al. reported that a relaxation-vibration frequency of a 1.3 μm band InGaAsP distortion quantum-well laser was optimized when its InGaAsP barrier layer composition had a forbidden band wave length of 1.05 μm (Proc. 54th Conf. J. Appl. Phys. Lecture No. 28p-H-6, pp. 1025).

In addition, in order to prevent the localization of the positive holes, it has been tried to form thin film barrier layers so as to increase possibility of migration of the positive holes to adjacent quantum-wells by tunnel effect. For example, Aoki et al. reported that a relaxation-vibration frequency of an InGaAs/InGaAsP quantum-well laser became twice when its barrier layer thickness was reduced from 10 nanometers to 5 nanometers (Proc. 51th Conf. J. Appl. Phys. Lecture No. 26a-R-6, pp. 914). Yamada et al. reported that the thinner the barrier layer was, the more differential gain of a 1.3 μm band InGaAsP quantum-well laser was increased when its barrier layer thickness was changed from 3 nanometers to 10 nanometers (Proc. 54th Conf. J. Appl. Phys. Lecture No. 28p-H-10, pp. 1027).

There is proposed another way to improve characteristics of a quantum-well laser device by Kasukawa et al (Japanese Patent Application Laid-open No. 4-120786). In Kasukawa et al., the quantum-well laser device comprises a GRIN-SCH (Graded Refractive Index-Separate Confinement Hetero) structure in which optical confinement layers having graded compositions are disposed on and under a quantum-well active layer so that distribution of optical electric field and confinement of electrons are optimized.

However, in the above reoptimization, the energy level difference between forbidden bands of the quantum-well layer and of the barrier layer is decreased so as to reduce the quantum-well effect. In case of the thin film barrier layers, electrons become three-dimensional so that a density of states is reduced so as to decrease gain. In addition, a band structure of positive holes is changed so as to reduce the quantum-well effect so that the quantum-well effect and the localization of the positive holes become trade-off in this case. In the GRIN-SCH structure, although the whole threshold carrier density is lowered, transfer of positive holes is not improved so that the problem of the localization of the positive holes is not resolved.

In order to improve characteristics of the semiconductor laser device, the trade-off between the quantum-well effect and the localization of the positive holes should be cancelled.

SUMMARY OF THE INVENTION

Accordingly, it is an object of the present invention to provide a semiconductor laser device having an active layer of a multi-layered quantum-well structure which has a large discontinuity of valence bands between of the quantum-well layer and of a barrier layer and in which localization of positive holes will not arise, which has excellent characteristics such as low threshold current, high quantum efficiency, good thermal properties, or high-speed modulation and has overcome the above mentioned defect of the conventional one.

The above and other objects of the present invention are achieved in accordance with the present invention by a quantum-well semiconductor laser device having a substrate, a clad layer on the substrate, an optical confinement layer on the clad layer, an active layer on the optical confinement layer, an optical confinement layer on the active layer and a clad layer on the optical confinement layer each of which formed of a semiconductor wherein the active layer formed of a multi-layer quantum-well structure of which each layer comprising a quantum-well layer, a first barrier layer adjacent the quantum-well layer and a second barrier layer adjacent the first barrier layer wherein the semiconductor of the first barrier has a higher energy level at a Γ point of a valence band than that of the second barrier layer.

In the above quantum-well semiconductor laser device, it is preferable that the semiconductor of the quantum-well layer has the same lattice parameters as the semiconductor of the substrate. It is also possible that the semiconductor of the quantum-well layer has lattice parameters different from those of the semiconductor of the substrate.

According to one embodiment of the present invention, the first barrier layer preferably has a thickness of from 1 to 5 nanometers. In this case, it is preferable that difference between energy levels at the $\Gamma$ points of the valence bands of the semiconductors of the first and second barrier layers ranges from 20 to 150 meV. it is also preferable that the energy level at the $\Gamma$ point of the valence band of the semiconductor of the first barrier layer is between the lowest energy level of positive holes in the quantum-well layer and the energy level at the $\Gamma$ point of the valence band of the semiconductor of the second barrier layer. In this case, the second barrier layer preferably has a thickness of from 2 to 10 nanometers.

The above and other objects, features and advantages of the present invention will be apparent from the following description of preferred embodiments of the invention with reference to the accompanying drawings.

DESCRIPTION OF THE PREFERRED EMBODIMENTS

Figure 1:
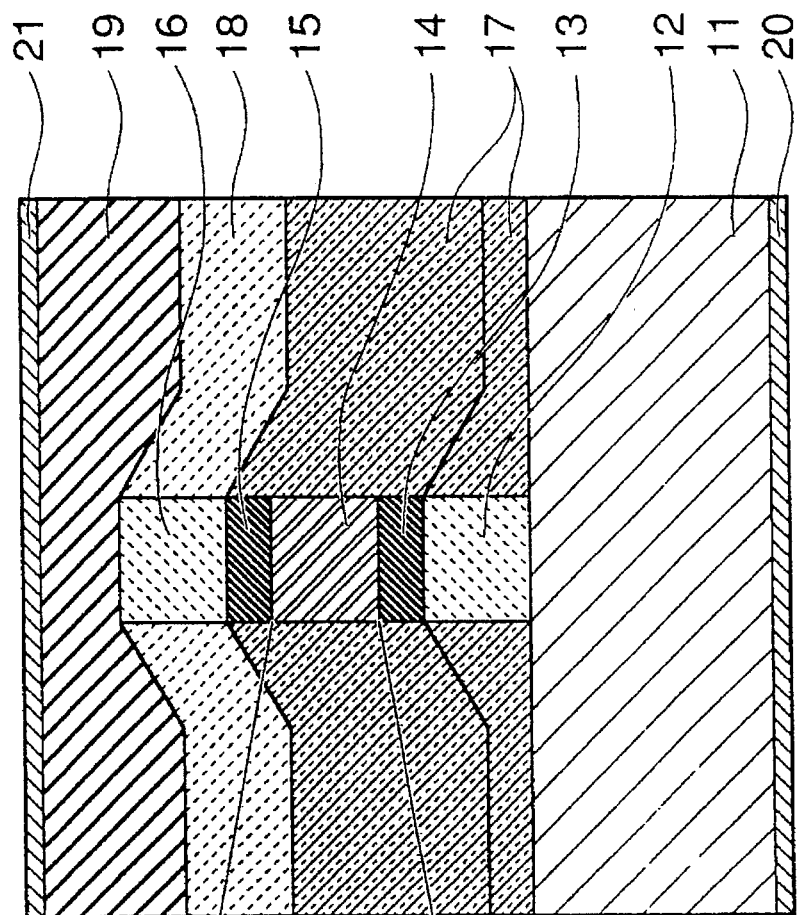
FIG. 1 shows a sectional view and a diagram of forbidden bands of a first embodiment of the quantum-well semiconductor laser device in accordance with the present invention.
Figure 1:
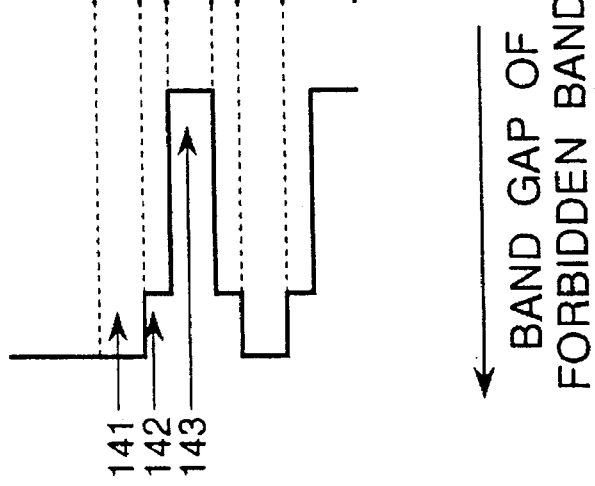

Referring to FIG. 1, there is shown a sectional view and a diagram of forbidden bands of a first embodiment of the quantum-well semiconductor laser device in accordance with the present invention. In FIG. 1, The quantum-well semiconductor laser device comprises an n-InP substrate 11, an n-InP clad layer 12 on a center portion of the substrate 11, an optical confinement layer 13 of non-doped InP on the clad layer 12, an active layer 14, an optical confinement layer 15 of non-doped InP on the active layer 14 and a p-InP clad layer 16 on the optical confinement layer 15.

The active layer 14 comprises ten quantum-well layers each constituted by a second barrier layer 141 of non-doped InP having a thickness of 10 nanometers, a first barrier layer 142 of non-doped InGaAsP mixed crystal having a band gap wavelength of 0.98 μm and a thickness of 2 nanometers, a well layer 143 of non-doped $In_{0.53}Ga_{0.47}As$ mixed crystal having a thickness of 7 nanometers, a first barrier layer 142 of non-doped InGaAsP mixed crystal having a band gap wavelength of 0.98 μm and a thickness of 2 nanometers and a second barrier layer 141 of non-doped InP having a thickness of 10 nanometers.

The n-InP clad layer 12, optical confinement layer 13, active layer 14, optical confinement layer 15 and p-InP clad layer 16 are stacked on the substrate 11 in the named order by a MOVPE method. The stacked structure is etched so as to form a mesa so that current block layers 17 of p-InP and n-InP, a clad layer 18 of p-InP and a contact layer 19 of p-InGaAsP mixed crystal having a band gap wavelength of 1.1 μm are embedded by a MOVPE method. Finally, electrodes 20 and 21 are formed on the bottom surface of the substrate 11 and on the top surface of the contact layer 19 so that the quantum-well type laser device is completed.

In the above quantum-well type laser device, potentials of the quantum-wells are varied in staircase. Energy levels at $\Gamma$ points of the well layer 143 and the first barrier layer 142 are 354 meV and 50 meV measured from the second barrier layer 141. Positive holes are reflected in multiple at interfaces between well layer 143 and the first barrier layer 142 and between the first barrier layer 142 and the second barrier layer 141. Due to interference of wave functions by the multiple reflection, permeability of the positive holes from the well layer 143 to the second barrier layer 141 is increased. Namely, the first barrier layer 142 plays the role of an antireflection coating for the positive holes.

Figure 2:
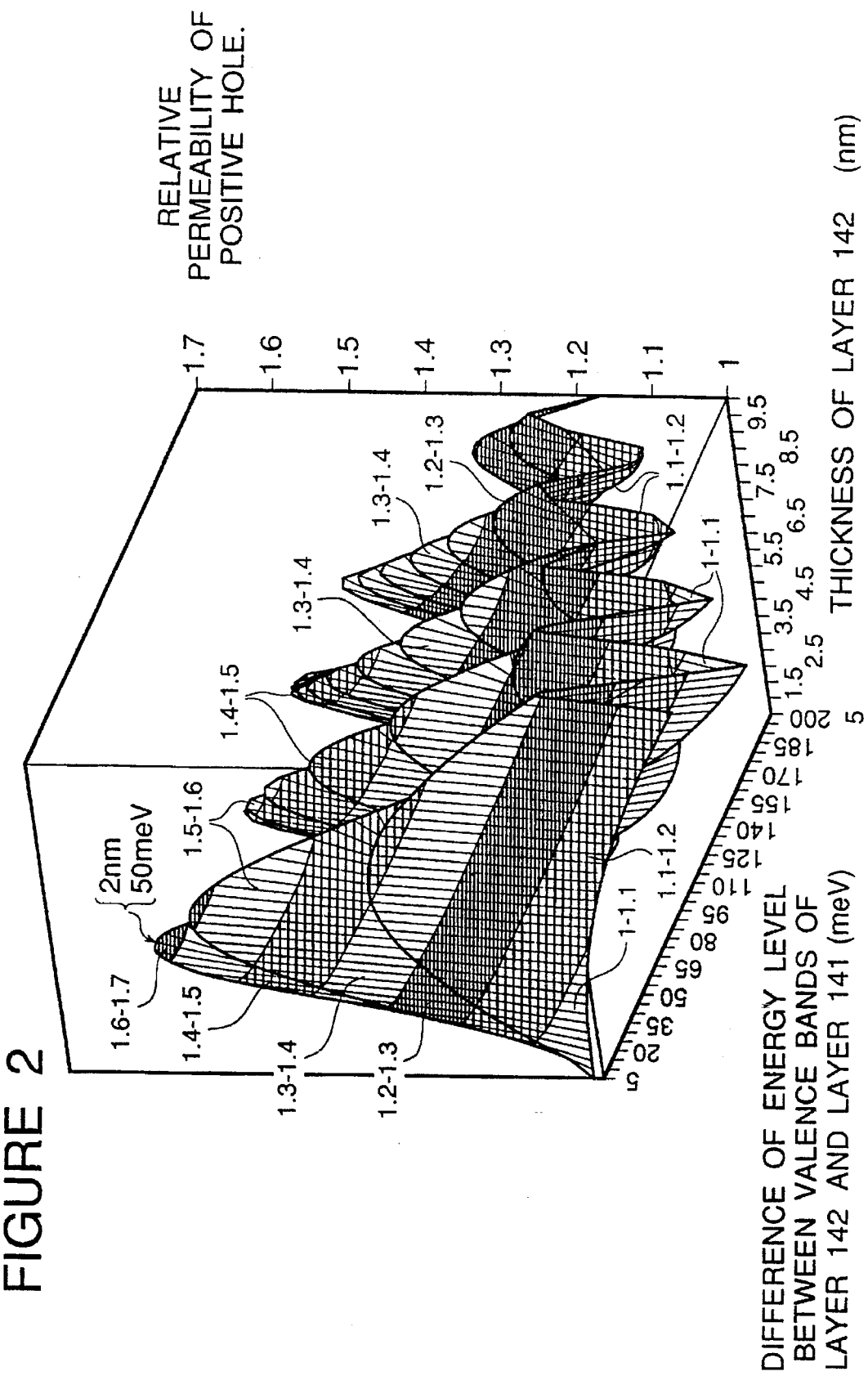
FIG. 2 is a graph which illustrates that a permeability of positive holes is improved by introducing a first barrier layer.

Referring to FIG. 2, it will be explained that permeability of positive holes is improved by introducing a first barrier layer.

FIG. 2 shows a graph which illustrates that a permeability of positive holes is improved by introducing a first barrier layer. In FIG. 2, the permeability of the positive holes are shown as functions of thickness of the first barrier layer 142 and a energy level difference between valence bands of the first and second barrier layers 142 and 141 when the well layer 143 is formed of $In_{0.53}Ga_{0.47}As$ and the second barrier layer is formed of InP, assuming that the permeability is equal to 1 when there is no first barrier layer 142. As shown in FIG. 2, the first barrier layer 142 improves the permeability of the positive holes. In particular, when the first barrier layer 142 has a thickness of 2 nanometers and the energy level difference between the valence bands of the first and second barrier layers 142 and 141 is equal to 50 meV, the permeability takes a maximum of 1.63. Thus, the reflection of the positive holes at interfaces of the quantum-wells is reduced so that the positive holes easily transmits to adjacent quantum-wells so as to prevent localization of the positive holes if an energy level of the second barrier 141 becomes higher. The lowest energy level of the positive holes changes as low as about 2 meV which can be negligible.

Figure 3:
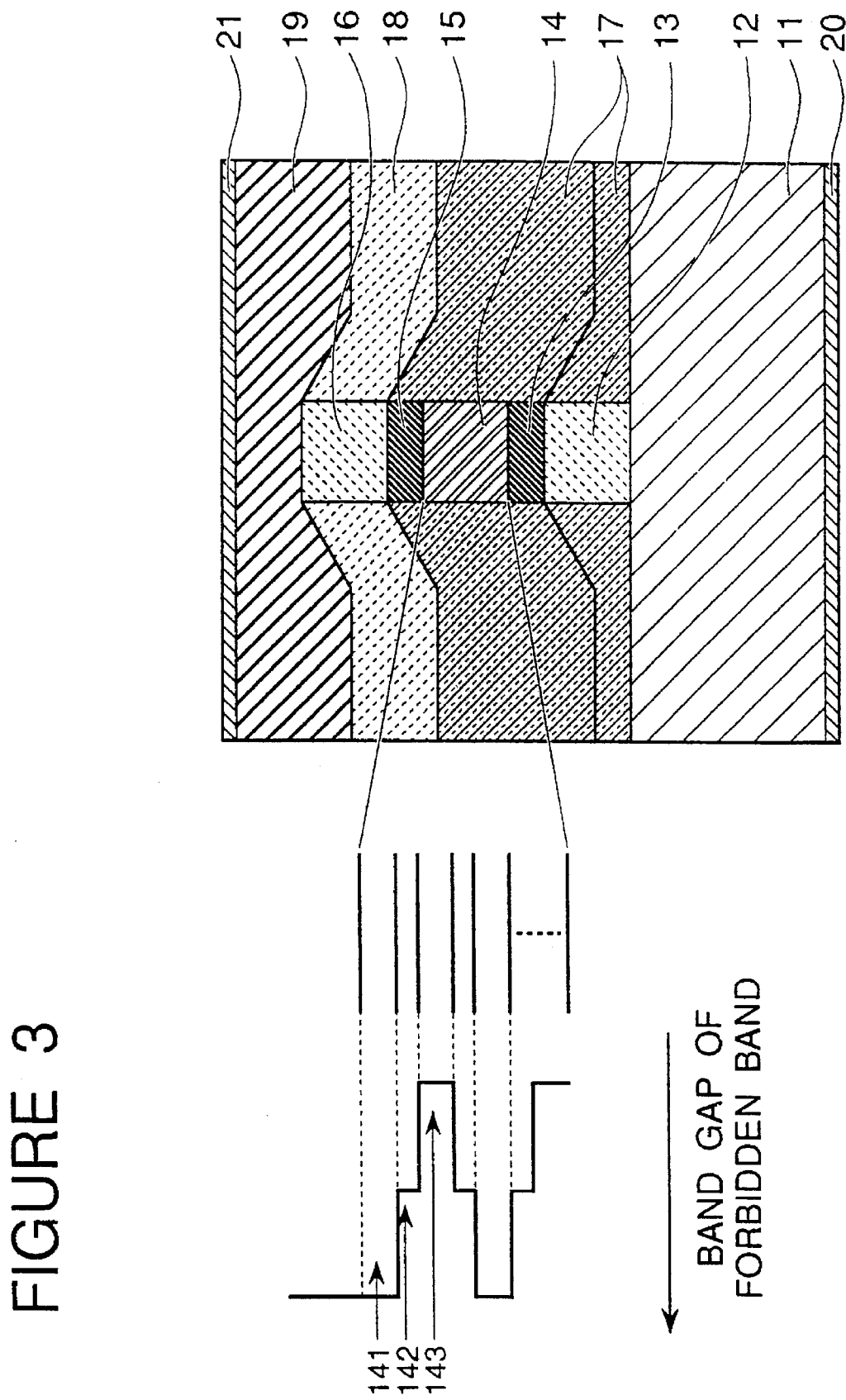
FIG. 3 shows a sectional view and a diagram of forbidden bands of a second embodiment of the quantum-well semiconductor laser device in accordance with the present invention.

Referring to FIG. 3, there is shown a sectional view and a diagram of forbidden bands of a second embodiment of the quantum-well semiconductor laser device in accordance with the present invention. In FIG. 3, The quantum-well semiconductor laser device comprises an n-InP substrate 11, an n-InP clad layer 12 on a center portion of the substrate 11, an optical confinement layer 13 of non-doped InGaAsP having a band gap wavelength of 0.95 μm on the clad layer 12, an active layer 14, an optical confinement layer 15 of non-doped InGaAsP having a band gap wavelength of 0.95 μm on the active layer 14 and a p-InP clad layer 16 on the optical confinement layer 15.

The active layer 14 comprises ten quantum-well layers each constituted by a second barrier layer 141 of non-doped InGaAsP having a band gap wavelength of 0.95 μm and a thickness of 5 nanometers, a first barrier layer 142 of non-doped InGaAsP mixed crystal having a band gap wavelength of 1.6 μm and a thickness of 2.5 nanometers, a well layer 143 of non-doped $In_{0.8}Ga_{0.2}As$ mixed crystal having a thickness of 2.3 nanometers, a first barter layer 142 of non-doped InGaAsP mixed crystal having a band gap wavelength of 1.6 μm and a thickness of 2.5 nanometers and a second barrier layer 141 of non-doped InGaAsP having a band gap wavelength of 0.95 μm and a thickness of 5 nanometers.

The n-InP clad layer 12, optical confinement layer 13, active layer 14, optical confinement layer 15 and p-InP clad layer 16 are stacked on the substrate 11 in the named order by a MOVPE method. The stacked structure is etched so as to form a mesa so that current block layers 17 of p-InP and n-InP, a clad layer 18 of p-InP and a contact layer 19 of p-InGaAsP mixed crystal having a band gap wavelength of 1.1 μm are embedded by a MOVPE method. Finally, electrodes 20 and 21 are formed on the bottom surface of the substrate 11 and on the top surface of the contact layer 19 so that the quantum-well type laser device is completed.

In the above quantum-well type laser device, potentials of the quantum-wells are varied in staircase. An energy level at Γ points of the well layer 143 to heavy positive holes is 560 meV and to light positive holes is 427 meV measured from the second barter layer 141. An energy level at Γ points of the first barrier layer 142 is 320 meV measured from the second barrier layer 141. The lowest energy level of the positive holes is –486 meV and an energy level of the light positive holes is –315 meV. In this case, the energy level of the light positive holes is higher than that of the first barrier layer 142 so that a wave function extends in the first barrier layer 142 and diffuses into the second barrier layer 141. By this, the light positive holes migrate to adjacent wells by the tunnel effect for 170 picoseconds which is shorter than a duration for which the light positive holes relax to the lowest energy level. Therefore, the positive holes efficiently migrate. On the other hand, the wave function of the lowest level positive holes localizes in the well layer 143 so that it is not affected by adjacent wells. Therefore, the quantum effect of the well layer 143 is not disturbed.

Figure 4:
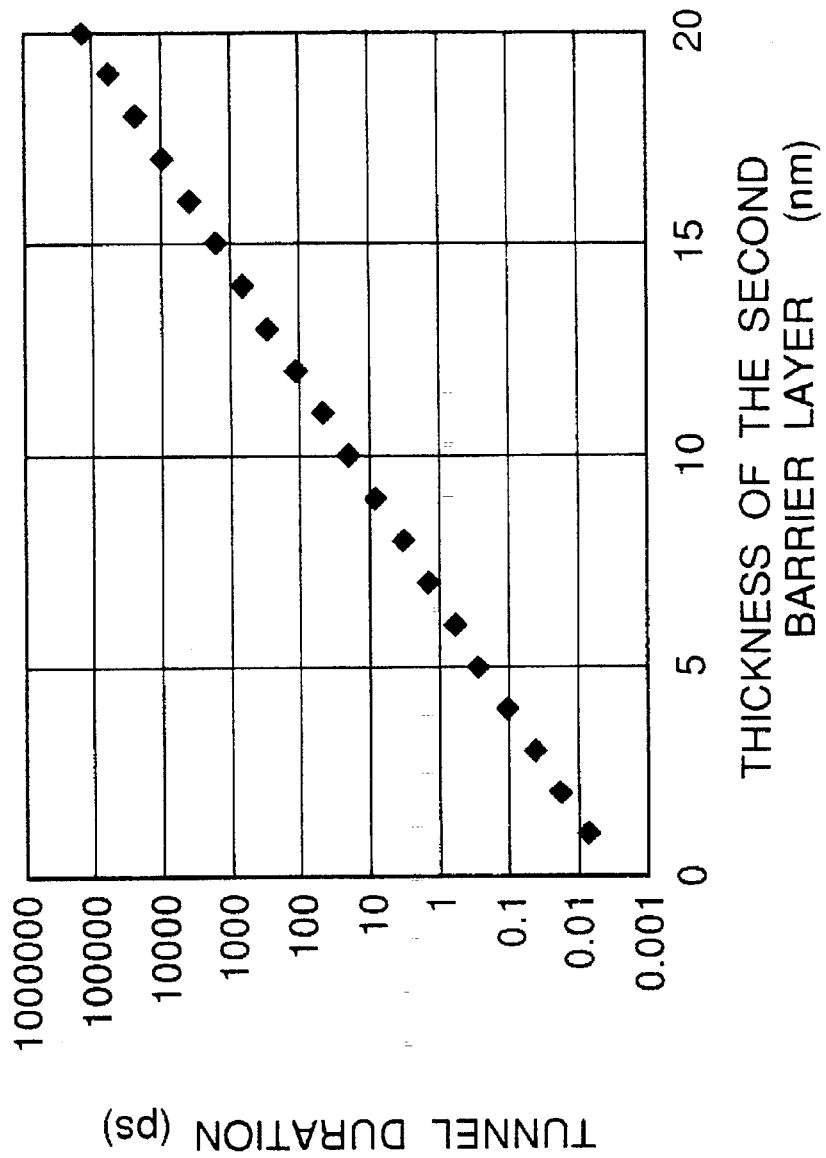
FIG. 4 is a graph which illustrates a relation between thickness of a second barrier layer and tunnel durations of light positive holes.

There is shown a graph illustrating relation between thickness of the second barrier layer and tunnel duration of the positive holes in FIG. 4. The second barrier layer preferably has a thickness of equal to or less than 10 nanometers, taking thickness of barrier layers determined by its material and tunnel duration into account.

In the above first embodiment of the quantum-well semiconductor laser device in accordance with the present invention, the well layer is formed of lattice-matched InGaAs with the InP substrate. In the second embodiment of the quantum-well semiconductor laser device in accordance with the present invention, the well layer is formed of InGaAs having 2.5 percent lattice distortion. However, the well layers can be formed of both lattice-matched InGaAs and InGaAs having a lattice distortion in the quantum-well semiconductor laser device in accordance with the present invention. In addition, the second barrier layer and the optical confinement layer can be formed of a mixed crystal including Al.

As explained above, according to the present invention, it is provided that a quantum-well semiconductor laser device having an active layer formed of a multi-layered quantum-well structure in which compositions of barrier layers are changed in staircase. This characteristic multi-layered quantum-well structure prevents localization of positive holes and improves properties such as threshold current, quantum efficiency, thermal characteristics, or high speed modulation of the quantum-well semiconductor laser device.

The invention has thus been shown and described with reference to the specific embodiments. However, it should be noted that the present invention is in no way limited to the details of the illustrated structures but changes and modifications may be made within the scope of the appended claims.

I claim:

1. A quantum-well semiconductor laser device having a substrate, a clad layer on the substrate, an optical confinement layer on the clad layer, an active layer on the optical confinement layer, an optical confinement layer on the active layer and a clad layer on the optical confinement layer each of which formed on a semiconductor wherein the active layer formed of a multi-layer quantum-well structure of which each layer comprising a quantum-well layer, a first barrier layer adjacent the quantum-well layer and a second barrier layer adjacent the first barrier layer wherein the semiconductor of the first barrier has a higher energy level at a Γ point of a valence band than a energy level at a Γ point of a valence band of the second barrier layer.

2. A quantum-well semiconductor laser device as claimed in claim 1; wherein the semiconductor of the quantum-well layer has the same lattice parameters as the semiconductor of the substrate.

3. A quantum-well semiconductor laser device as claimed in claim 1; wherein the semiconductor of the quantum-well layer has lattice parameters different from those of the semiconductor of the substrate.

4. A quantum-well semiconductor laser device as claimed in claim 1; wherein the first barrier layer has a thickness of from 1 to 5 nanometers.

5. A quantum-well semiconductor laser device as claimed in claim 4; wherein difference between energy levels at the Γ points of the valence bands of the semiconductors of the first and second barrier layers ranges from 20 to 150 meV.

6. A quantum-well semiconductor laser device as claimed in claim 4; wherein the energy level at the Γ point of the valence band of the semiconductor of the first barrier layer is between the lowest energy level of positive holes in the quantum-well layer and the energy level at the Γ point of the valence band of the semiconductor of the second barrier layer.

7. A quantum-well semiconductor laser device as claimed in claim 6; wherein the second barrier layer has a thickness of from 2 to 10 nanometers.

8. A quantum-well semiconductor laser device comprising:

an active layer formed of a plurality of multi-layered quantum-well structures, each having a well layer, a first barrier adjacent said well layer, and a second barrier layer adjacent said first barrier layer; and wherein the semiconductor of the first barrier has a higher energy level at a Γ point of a valence band than a energy level at a Γ point of a valence band of the second barrier layer.

9. A quantum-well semiconductor laser device as claimed in claim 8; wherein the first barrier layer has a thickness of from 1 to 5 nanometers.

10. A quantum-well semiconductor laser device as claimed in claim 9; wherein the energy level at the Γ point of the valence band of the semiconductor of the first barrier layer is between the lowest energy level of positive holes in the quantum-well layer and the energy level at the Γ point of the valence band of the semiconductor of the second barrier layer.

11. A quantum-well semiconductor laser device as claimed in claim 9; wherein the second barrier layer has a thickness of from 2 to 10 nanometers.

12. A quantum-well semiconductor laser device as claimed in claim 11; wherein the difference between energy levels at the Γ points of the valence bands of the semiconductors of the first and second barrier layers ranges from 20 to 150 meV.

13. A quantum-well semiconductor laser device as claimed in claim 12; wherein the first barrier layer is made of non-doped InGaAsP having a band gap wavelength of from 0.98 μm to 1.6 μm.

14. A quantum-well semiconductor laser device as claimed in claim 13; wherein the second barrier layer is made of non-doped InP.

15. A quantum-well semiconductor laser device as claimed in claim 14; wherein the well layer is made of InGaAs having a thickness of from 2.3 to 7 nanometers.

16. A quantum-well semiconductor laser device comprising:
   an active layer formed of a plurality of multi-layered quantum-well structures, each having a well layer, a first barrier adjacent said well layer, and a second barrier layer adjacent said first barrier layer; and
   means for increasing the permeability of positive holes between said well layers of adjacent quantum-well structures in said active layer.

17. A quantum-well semiconductor laser device as claimed in claim 16, further comprising:
   a substrate;
   a first clad layer formed on a first surface of said substrate;
   a first optical confinement layer formed on said first clad layer with said active layer formed thereon;
   a second optical confinement layer formed on said active layer;
   a second clad layer formed on said second optical confinement layer;
   a contact layer formed on said second clad layer;
   a first electrode formed on said contact layer; and
   a second electrode formed on a second surface of said substrate.

* * * * *